(12) United States Patent
Komatsu et al.

(10) Patent No.: US 12,431,868 B2
(45) Date of Patent: Sep. 30, 2025

(54) MULTI-MODE SURFACE ACOUSTIC WAVE FILTER WITH IMPEDANCE CONVERSION

(71) Applicant: Skyworks Solutions, Inc., Irvine, CA (US)

(72) Inventors: Tomoya Komatsu, Irvine, CA (US); Yiliu Wang, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 280 days.

(21) Appl. No.: 17/886,956

(22) Filed: Aug. 12, 2022

(65) Prior Publication Data

US 2023/0083961 A1  Mar. 16, 2023

Related U.S. Application Data

(60) Provisional application No. 63/242,738, filed on Sep. 10, 2021.

(51) Int. Cl.
*H03H 9/64* (2006.01)
*H03H 9/72* (2006.01)

(52) U.S. Cl.
CPC .......... *H03H 9/6483* (2013.01); *H03H 9/725* (2013.01)

(58) Field of Classification Search
CPC .......... H03H 9/02834; H03H 9/02574; H03H 9/6436; H03H 9/706; H03H 9/02685; H03H 9/6476; H03H 9/568; H03H 9/6406; H03H 9/72; H03H 9/14541; H03H 9/02228; H03H 9/145; H03H 9/6463; H03H 9/703; H03H 9/02692; H03H 9/02708; H03H 9/175; H03H 9/643; H03H 9/645; H03H 9/6469; H03H 9/02842; H03H 9/605; H03H 9/205; H03H 9/542; H03H 9/14582; H03H 9/64; H03H 9/02102; H03H 9/14544; H03H 9/564; H03H 9/70; H03H 9/02007; H03H 9/6483; H03H 9/25; H03H 9/725; H04B 1/40; H04B 1/0057; H03F 2200/451; H03F 2200/111; H03F 3/195; H03F 3/19; (Continued)

(56) References Cited

U.S. PATENT DOCUMENTS 7,701,311 B2 *  4/2010  Nakamura ............. H03H 9/725
                                                    333/133
9,231,557 B2    1/2016  Umeda et al.
(Continued)

FOREIGN PATENT DOCUMENTS

JP  2010-252359  11/2010

OTHER PUBLICATIONS

Hashimoto et al., "Operation Mechanism of Double-Mode Surface Acoustic Wave Filters with Pitch-Modulated IDTs and Reflectors", 2005 IEEE Ultrasonics Symposium, pp. 2157-2161.

*Primary Examiner* — Lincoln D Donovan
*Assistant Examiner* — Tyler J Pereny
(74) *Attorney, Agent, or Firm* — Knobbe, Martens, Olson & Bear, LLP (57) ABSTRACT

Aspects of this disclosure relate to an acoustic wave filter that includes a multi-mode surface acoustic wave filter and a ladder section. The multi-mode surface acoustic wave filter has a higher impedance at an output than at an input. The ladder section is connected to the output of the multi-mode surface acoustic wave filter. Related radio frequency systems, radio frequency modules, wireless communication devices, and methods are disclosed.

20 Claims, 10 Drawing Sheets

(58) Field of Classification Search
CPC ...... H03F 3/245; H03F 1/56; H03F 2200/294; H03F 2203/7209; H03F 3/72
See application file for complete search history.

(56) References Cited

U.S. PATENT DOCUMENTS

| | | | |
|---|---|---|---|
| 9,300,038 B2* | 3/2016 | Burgener | H03H 9/542 |
| 10,469,056 B2* | 11/2019 | Ruby | H03H 9/0576 |
| 2003/0128081 A1* | 7/2003 | Ella | H03H 9/0571 |
| | | | 333/133 |
| 2004/0207491 A1 | 10/2004 | Nakaya et al. | |
| 2018/0041188 A1* | 2/2018 | Shoda | H03F 1/26 |
| 2020/0162054 A1 | 5/2020 | Goto | |
| 2020/0162055 A1 | 5/2020 | Goto | |
| 2020/0162056 A1 | 5/2020 | Goto | |
| 2021/0143795 A1* | 5/2021 | Azizi | H04B 1/12 |

* cited by examiner

MULTI-MODE SURFACE ACOUSTIC WAVE FILTER WITH IMPEDANCE CONVERSION

CROSS REFERENCE TO PRIORITY APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/242,738, filed Sep. 10, 2021 and titled "MULTI-MODE SURFACE ACOUSTIC WAVE IMPEDANCE CONVERSION," the disclosures of which is hereby incorporated by reference in its entirety and for all purposes.

BACKGROUND

Technical Field

Embodiments of this disclosure relate to acoustic wave filters.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of acoustic wave resonators arranged to filter a radio frequency signal. Example acoustic wave filters include surface acoustic wave (SAW) filters and bulk acoustic wave (BAW) filters. A SAW resonator of a SAW filter typically includes an interdigital transductor electrode on a piezoelectric substrate. A SAW resonator is arranged to generate a surface acoustic wave. SAW filters include multi-mode SAW filters, such as double mode SAW (DMS) filters.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter that includes a multi-mode surface acoustic wave filter and a ladder section connected to an output of the multi-mode surface acoustic wave filter. The multi-mode surface acoustic wave filter includes an input and the output. The multi-mode surface acoustic wave filter has a higher impedance at the output than at the input. The ladder section includes at least one shunt acoustic wave resonator and at least one series acoustic wave resonator. The acoustic wave filter is configured to filter a radio frequency signal.

The acoustic wave filter can be a receive filter. The acoustic wave filter can be a transmit filter.

The input can include at least one more track than the output. The at least one more track can be a single track. The input can have more interdigital transducer electrode fingers than the output.

The acoustic wave filter can have a passband. The output can have an impedance of greater than 50 Ohms for the passband.

The at least one shunt acoustic wave resonator and the at least one series acoustic wave resonator can be surface acoustic wave resonators.

Another aspect of this disclosure is a radio frequency system that includes a low noise amplifier and an acoustic wave filter. The acoustic wave filter includes a multi-mode surface acoustic wave filter and a ladder section. The ladder section is in a signal path between the multi-mode surface acoustic wave filter and an input of the low noise amplifier. The multi-mode surface acoustic wave filter includes an input and an output. The multi-mode surface acoustic wave filter has a higher impedance at the output than at the input.

The radio frequency system can include an antenna. The acoustic wave filter can be in a signal path between the antenna and the low noise amplifier.

The radio frequency system can include matching network coupled between the ladder section and the low noise amplifier. The matching network can consist of a series inductor.

The input of the multi-mode surface acoustic wave filter can have at least one more track than the output of the multi-mode surface acoustic wave filter. The input of the multi-mode surface acoustic wave filter can have more interdigital transducer electrode fingers than the output of the multi-mode surface acoustic wave filter. The output of the multi-mode surface acoustic wave filter can have an impedance of greater than 50 Ohms.

Another aspect of this disclosure is a wireless communication device comprising that includes an acoustic wave filter, an antenna operatively coupled to the acoustic wave filter, a radio frequency amplifier operatively coupled to the acoustic wave filter and configured to amplify a radio frequency signal, and a transceiver in communication with the radio frequency amplifier. The acoustic wave filter includes a multi-mode surface acoustic wave filter and a ladder section. The multi-mode surface acoustic wave filter includes an input and an output. The multi-mode surface acoustic wave filter has a higher impedance at the output than at the input. The ladder section is connected to the output of the multi-mode surface acoustic wave filter.

The radio frequency amplifier can be a low noise amplifier having an input. The ladder section can be in a signal path between the multi-mode surface acoustic wave filter and the input of the low noise amplifier.

The input of the multi-mode surface acoustic wave filter can have at least one more track than the output of the multi-mode surface acoustic wave filter. The input of the multi-mode surface acoustic wave filter can have more interdigital transducer electrode fingers than the output of the multi-mode surface acoustic wave filter. The output of the multi-mode surface acoustic wave filter can have an impedance of greater than 50 Ohms.

The wireless communication device can be a mobile phone.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With fourth generation (4G) Long Term Evolution (LTE) and fifth generation (5G) technology introduction, more frequency bands are added to an already crowded spectrum for a number of frequency bands. This can lead to more filters in a radio frequency (RF) frond end module (FEM). An RF FEM will become bigger with more filters if filter size remains the same. However, consumers do not want to carry bulky smartphones. Accordingly, reducing the size of a filter is desired.

There is typically a trade-off between filter size reduction and maintaining filter performance specifications. For example, reducing filter size by including fewer ladder stages can degrade filter rejection. As another example, with fewer cascaded acoustic wave resonators, a filter can have less ruggedness. However, it is desired to have reduced size filter while maintaining high performance.

Acoustic wave filters can filter radio frequency (RF) signals in a variety of applications, such as in an RF front end of a mobile phone. A multi-mode surface acoustic wave (MMS) filter is a type of an acoustic wave filter. MMS filters include a plurality of interdigital transducer (IDT) electrodes that are longitudinally coupled to each other and positioned between acoustic reflectors. Some MMS filters are referred to as double mode surface acoustic wave (DMS) filters. There may be more than two modes of such DMS filters and/or for other MMS filters. MMS filters can have a relatively wide passband due to a combination of various resonant modes. MMS filters can have a balanced (differential) input and/or a balanced output with proper arrangement of IDTs. MMS filters can have a single-ended input and/or a single-ended output in certain applications. MMS filters can achieve a relatively low loss and a relatively good out of band rejection.

In certain applications, MMS filters can be receive filters arranged to filter radio frequency signals received by an antenna. An MMS filter can be included in a receive filter that also includes a plurality of acoustic resonators arranged in a ladder topology. In some other applications, an MMS filter can be included in a transmit filter that also includes a plurality of acoustic wave resonator arranged in a ladder topology.

Figure 1:
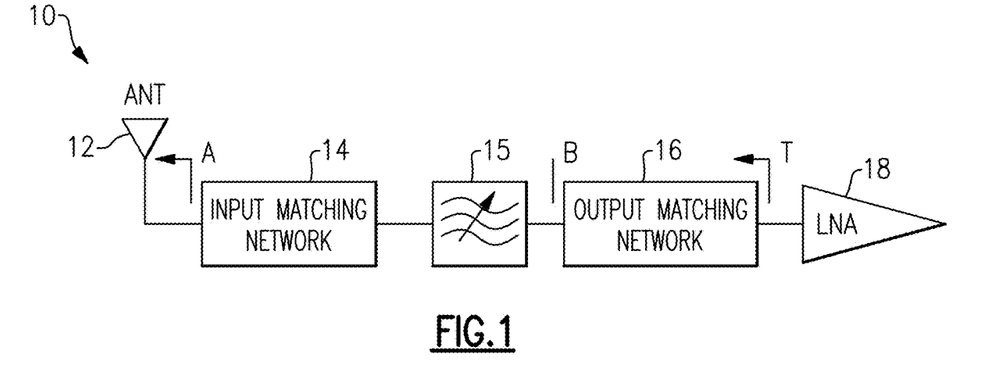
FIG. 1 is a schematic diagram of an example radio frequency (RF) system.

FIG. 1 illustrates an example RF system 10. The RF system 10 can process an RF signal received by an antenna. An acoustic wave filter according to any suitable principles and advantages disclosed herein can be included in the RF system 10. The illustrated RF system 10 includes an antenna 12, an input matching network 14, a filter 15, an output matching network 16, and a low noise amplifier (LNA) 18.

Figure 2:
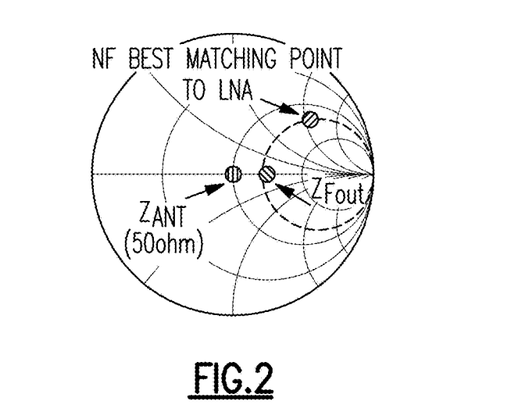
FIG. 2 is a Smith chart associated with the RF system of FIG. 1.

FIG. 2 is a Smith chart associated with the RF system 10 of FIG. 1. For achieving a best noise floor (NF) in a receive chain, the impedance at reference plane T of the RF system 10 should match to the NF best matching point of the LNA 18 of the RF system 10 on the Smith chart shown in FIG. 2. To reach point T with a single series inductor, impedance at plane B of the RF system 10 is preferred to be at $Z_{FOUT}$ on the Smith chart of FIG. 2. Accordingly, the output matching network 16 of FIG. 1 can consist of a single series inductor in certain applications. Impedance at plane A is at the antenna impedance $Z_{ANT}$, which can be 50 Ohms. The filter 15 can have an impedance conversion from $Z_{ANT}$ to $Z_{FOUT}$. This can achieve desirable NF performance with a single component output matching network 16.

By designing interdigital transducer (IDT) electrode tracks of a multi-mode surface acoustic wave (MMS) filter input and output, impedance conversion can be implemented. This can be helpful for an LNA co-design in a receive filter that includes an MMS filter.

Figure 3:
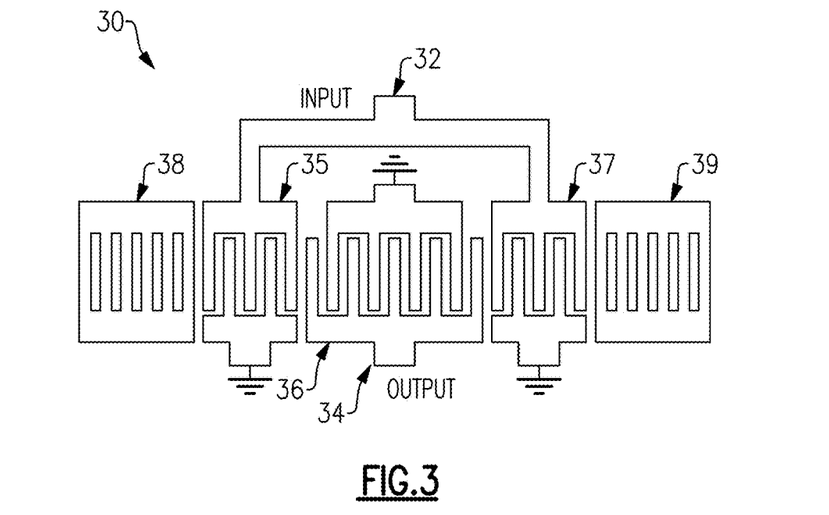
FIG. 3 is a diagram of an example multi-mode surface acoustic wave (MMS) filter according to an embodiment.

FIG. 3 schematically illustrates an example MMS filter 30. The illustrated MMS filter 30 includes an input 32, an output 34, IDT electrodes 35, 36, and 37, and acoustic reflectors 38 and 39. The input 32 can be referred to as an input node. The output 34 can be referred to as an output node. The IDT electrodes 35, 36, and 37 are longitudinally coupled to each other. The IDT electrodes 35, 36, and 37 are positioned between acoustic reflectors 38 and 39. In FIG. 3, the input 32 has two tracks of IDT electrodes connected in parallel and the output 34 has one track of IDT electrodes. Assuming a single IDT finger impedance is A, impedance of parallel connection of N fingers should be proportional to A/N. Therefore, with more tracks being connected, the corresponding impedance should be smaller. MMS filters disclosed herein have an input with more tracks than an output. The input can also have more IDT electrode fingers than the output. The input has lower impedance than the output. Accordingly, the MMS filter can transform a 50 Ohm impedance at the input to an impedance that is higher than 50 Ohms at the output.

For certain duplexer monolithic designs with transit and receive filters on the same chip, a ladder section can be before an MMS filter in the receive filter design such that the MMS filter is in a signal path between the ladder section and an LNA. This topology can reduce and/or eliminate high power reflected from an antenna or transmit side port, help with power handling, improve gamma (S11) performance in a transmit band, the like, or any suitable combination thereof.

Figure 4:
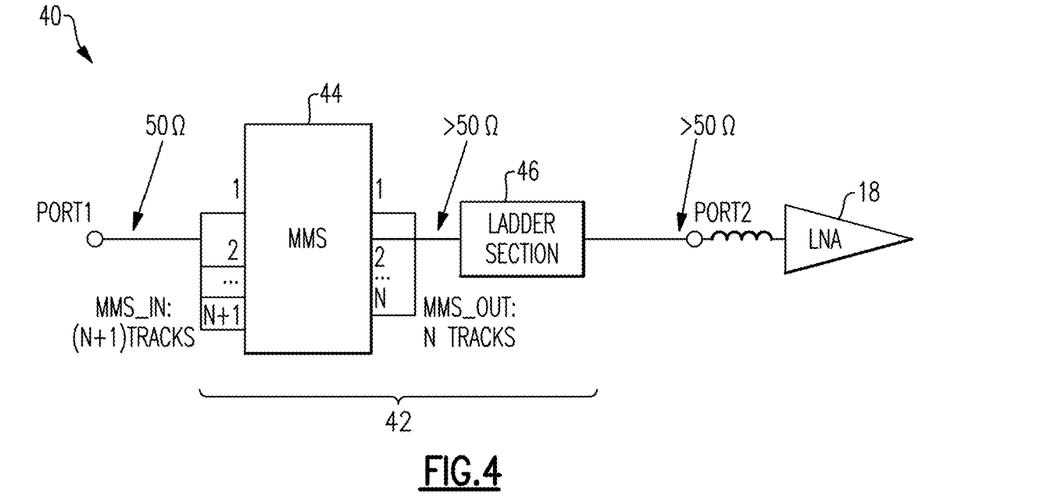
FIG. 4 is a schematic diagram of an RF system that includes a filter with an MMS filter and a ladder section in a receive path according to an embodiment.

FIG. 4 is a schematic diagram of an RF system 40 that includes a filter 42 and an LNA 18. The filter 42 includes an MMS filter 44 and a ladder section 46. The ladder section 46 is in a signal path from the MMS filter 44 to the LNA 18. In the RF system 40, an RF signal propagates from an input of the MMS filter 44 to the LNA 18 by way of the ladder section 46.

The MMS filter 44 has fewer output tracks than input tracks. In addition, the input of the MMS filter 44 has more IDT fingers than the output of the MMS filter 44. As illustrated in FIG. 4, the MMS filter 44 has N+1 input tracks and N output tracks, where N is a positive integer. Having more input tracks than output tracks can achieve higher impedance at the output of the MMS filter 44 than at the input of the MMS filter 44. For example, there can be a 50 Ohm input impedance for the MMS filter 44 and a greater than 50 Ohm output impedance for the MMS filter 44. These impedances can be for a passband of the filter 40. The MMS filter 44 can provide an impedance transformation to increase impedance from its input to its output. The ladder section 46 can also have an increased impedance and smaller size. There can be a narrower IDT electrode aperture to achieve a higher impedance (smaller $C_0$) to help achieve a better overall receive chain noise floor.

The ladder section 46 can include at least one series acoustic wave resonator and at least one shunt acoustic wave resonator. The ladder section 46 can include any suitable number of series acoustic wave resonators and any suitable number of shunt acoustic wave resonators for a particular application.

The filter 42 of FIG. 4 can have a reduced size relative to a similar filter with an MMS filter in a signal path between a ladder section and an LNA. At the same time, the filter 42 of FIG. 4 can achieve similar or better filter performance than the similar filter.

Figure 5:
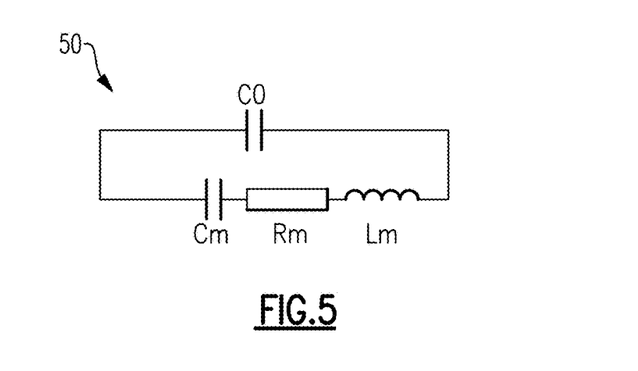
FIG. 5 is a schematic diagram of an equivalent circuit model for a 1-port resonator.

FIG. 5 is a schematic diagram of an equivalent circuit model 50 for a 1-port resonator. A 1-port resonator can be an acoustic wave resonator included in a ladder section of an acoustic wave filter. The impedance of the 1-port resonator can mainly be determined by a static branch with static capacitance. The static branch of the equivalent circuit mode is $1/j\omega C0$. With higher impedance, resonator size is smaller.

For a filter that includes an MMS filter and a ladder section, the MMS output side can have fewer tracks and/or smaller total number of IDT electrodes so that the output impedance is higher than the input impedance. With this higher output impedance, smaller size acoustic wave resonators can be used to form the ladder section to connect to an MMS filter output. This can advantageously reduce size of the filter relative to a similar filter with a ladder section connected to an MMS filter input.

Figure 6A:
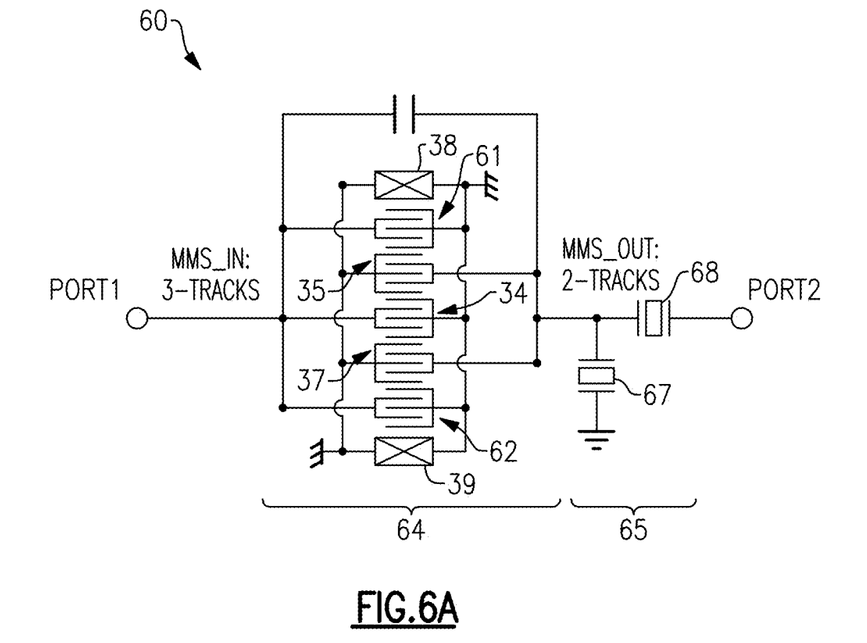
FIG. 6A is a schematic diagram of a filter according to an embodiment.

FIG. 6A is a schematic diagram of a filter 60 according to an embodiment. The filter 60 includes an MMS filter 64 and a ladder section 65 connected to an output of the MMS filter 64. The filter 60 is configured to filter an RF signal. The filter 60 has an input Port 1 and an output Port 2. In the filter 60, the RF signal propagates from the input Port 1 to the output Port 2.

The illustrated MMS filter 64 includes 3 input tracks and 2 output tracks. Each of these tracks corresponds to a track in physical layout. Any suitable numbers of input tracks and output tracks can be implemented, where there is at least one more input track than output track(s). The MMS filter 64 includes IDT electrodes 35, 36, 37, 61, and 62. These IDT electrodes are longitudinally coupled to adjacent IDT electrode(s). The IDT electrodes 35, 36, 37, 61, and 62 are positioned between acoustic reflectors 38 and 39. An MMS filter in accordance with any suitable principles and advantages disclosed herein can include an odd number of IDT electrodes longitudinally coupled to each other, where the odd number is 3 or greater. For example, the MMS filter 30 of FIG. 3 includes 3 IDT electrodes longitudinally coupled to each other. As another example, the MMS filter 64 includes 5 IDT electrodes longitudinally coupled to each other.

In FIG. 6A, the output impedance of the MMS filter 64 is higher than 50 Ohms, and the acoustic wave resonators 67 and 68 of the ladder section 65 can also have an impedance that is higher than 50 Ohms to match to MMS filter 64. These impedances can be for a passband of the filter 60. As resonator impedance is typically inversely reverse proportional to its size. Accordingly, acoustic wave resonators 67 and 68 with respective impedances of greater than 50 Ohms can be smaller than similar resonators with 50 Ohm impedances.

MMS filters can be temperature compensated by including a temperature compensation layer, such as a silicon dioxide ($SiO_2$) layer, over IDT electrodes. Such a temperature compensation layer can cause a temperature coefficient of frequency (TCF) of an MMS filter to be closer to zero. In some instances, an MMS filter can include a multi-layer piezoelectric substrate.

The ladder section 65 is one example that can implement the ladder section 46 of FIG. 4. In FIG. 6A, the illustrated ladder section 65 includes a single ladder stage with a shunt acoustic wave resonator 67 and a series acoustic wave resonator 68. Any suitable numbers of series acoustic wave resonators and any number of shunt acoustic wave resonators can be implemented. The acoustic wave resonators of the ladder sections disclosed herein (e.g., the ladder section 46, the ladder section 65, and/or the ladder section 86) can include any suitable acoustic wave resonators. The acoustic wave resonators of such a ladder section can include one or more surface acoustic wave (SAW) resonators, one or more temperature compensated SAW (TCSAW) resonators, one or more multilayer piezoelectric substrate (MPS) SAW resonators, one or more bulk acoustic wave (BAW) resonators such as one or more film bulk acoustic wave resonators (FBARs) and/or one or more BAW solidly mounted resonators (SMRs), one or more Lamb wave resonators, one or more boundary wave resonators, the like, or any suitable combination thereof.

The filter 60 of FIG. 6A has a smaller area than a similar filter where the ladder section is connected to the input of an MMS filter. In one example application, the filter 60 of FIG. 6A has an area that is about 15% to about 18% less than the similar filter where the ladder section is connected to the input of the MMS filter.

Figure 6B:
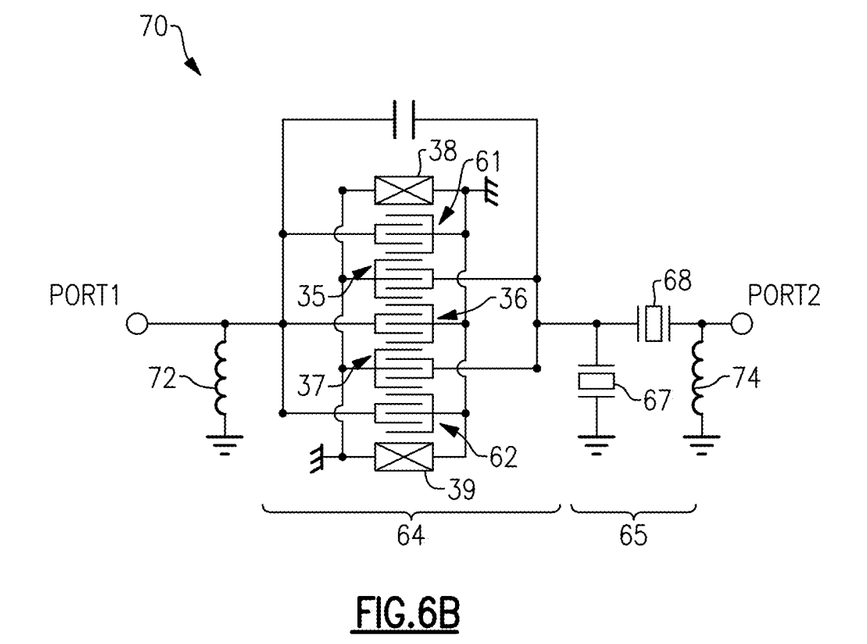
FIG. 6B is a schematic diagram of a filter according to an embodiment.

FIG. 6B is a schematic diagram of a filter 70 according to an embodiment. The filter 70 includes a first shunt inductor 72 connected to the input Port 1 and the second shunt inductor 74 connected to the output Port 2. In some applications, the filter 70 can be a receive filter implemented in a multiplexer with one or more other receive filters. In such an application, another receive filter can be implemented with at least one less ladder stage than for a filter that is similar to the filter 70 except for having a ladder section connected to an input side of an MMS filter instead of the output side of the MMS filter. The other receive filter having fewer resonators can lead to a further reduction in area for the multiplexer.

Figure 7:
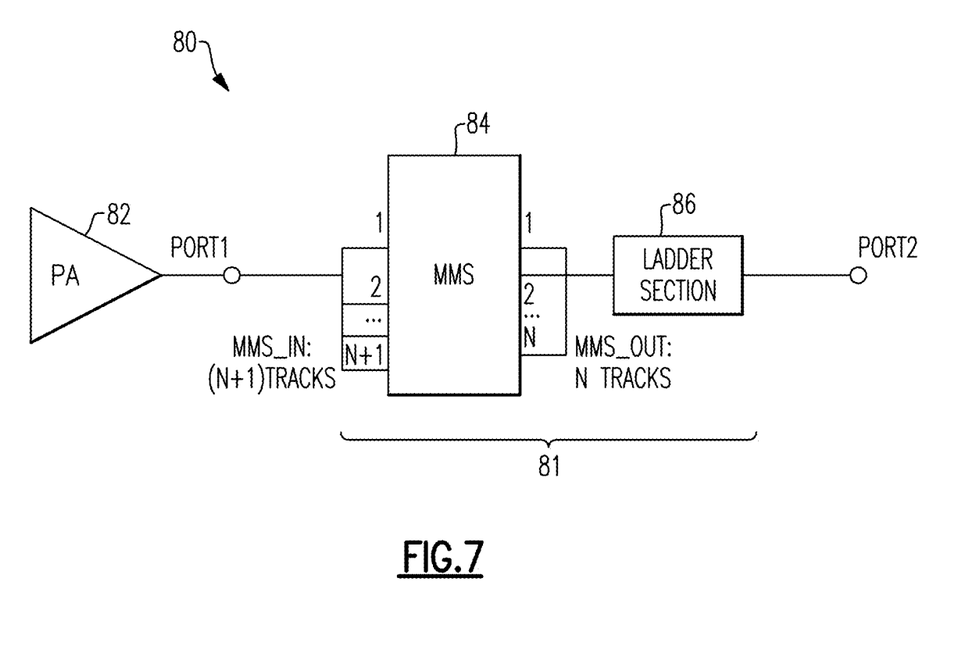
FIG. 7 is a schematic diagram of an RF system that includes a filter with an MMS filter and a ladder section in a transmit path according to an embodiment.

Any suitable principles and advantages disclosed herein can be implemented in a transmit filter. In transmit applications, an MMS filter can be used if the MMS filter can meet system power specifications. FIG. 7 is a schematic diagram of an RF system 80 with a filter 81 in a transmit path. The filter 81 can filter a radio frequency signal in a transmit signal path between a 82 power amplifier and an antenna. As shown in FIG. 7, an output of the power amplifier 82 can be connected to an input of the MMS filter 84. It can be desirable for the power amplifier 82 output to be at a low impedance. With the output of the power amplifier 82 connected to the input of the MMS filter 84, the power amplifier output can have a lower impedance than a similar filter with a ladder filter connected between the power amplifier output and an MMS filter.

In FIG. 7, the illustrated MMS filter 84 is in a signal path between the power amplifier 82 and a ladder section 86 of the filter 81. The ladder section 86 is connected to the output of the MMS filter 84. The ladder section 86 can have an input at a higher impedance than the input of the MMS filter 86. An antenna port Port 2 of the filter 81 of FIG. 7 can be connected to an antenna directly or by way of one or more intervening circuit elements, such as a switch.

Although embodiments discussed above may include filters with a single MMS filter, a filter can include two or more MMS filters in series and/or in parallel with each other in some other applications in accordance with any suitable principles and advantages disclosed herein.

Figure 8A:
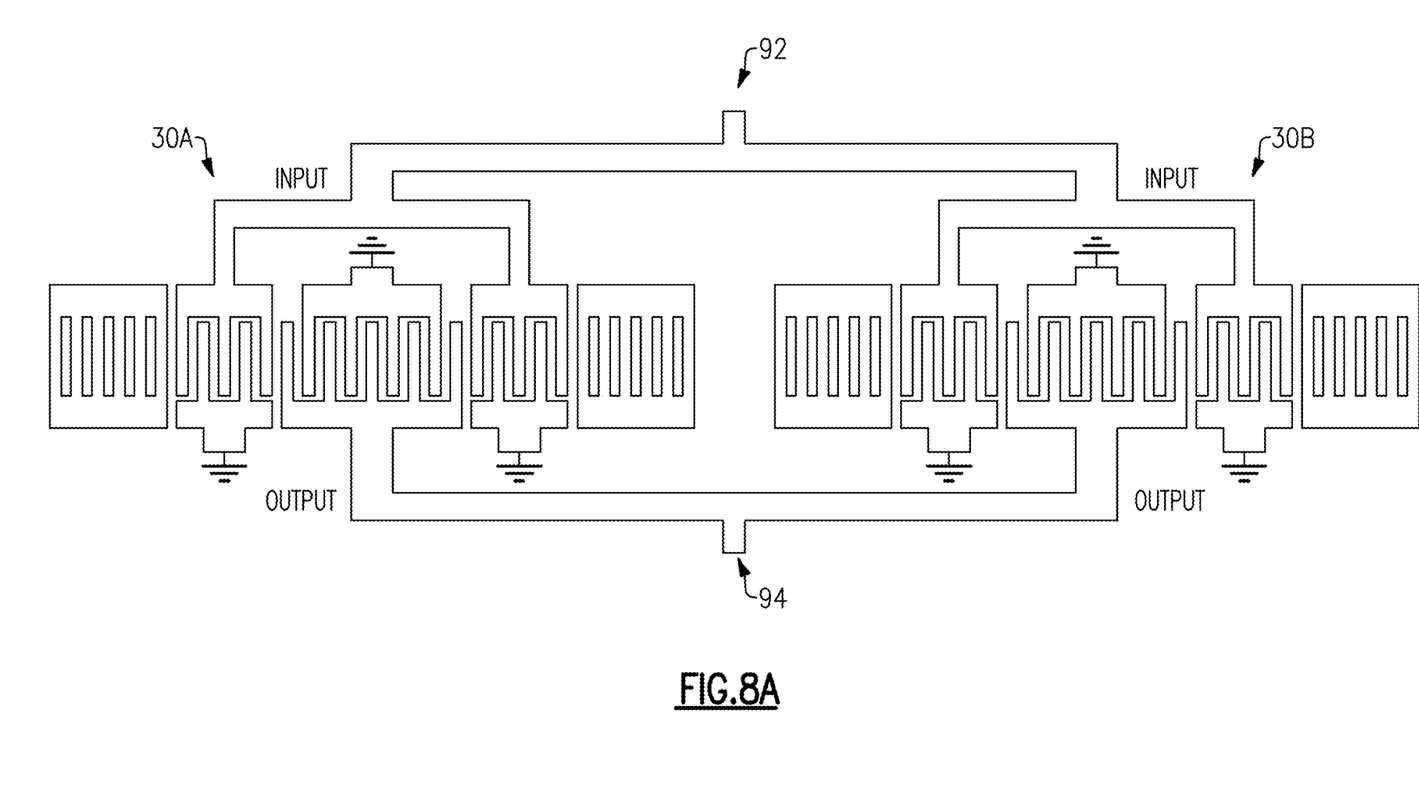
FIG. 8A illustrates two MMS filters in parallel with each other.

FIG. 8A illustrates two MMS filters 30A and 30B in parallel with each other. The MMS filters 30A and 30B have a common input 92 and a common output 94. The output 94 can have a higher impedance than the input 92 for a passband of the parallel MMS filters 30A and 30B. The output 94 can be connected to a ladder section in accordance with any suitable principles and advantages disclosed herein.

Figure 8B:
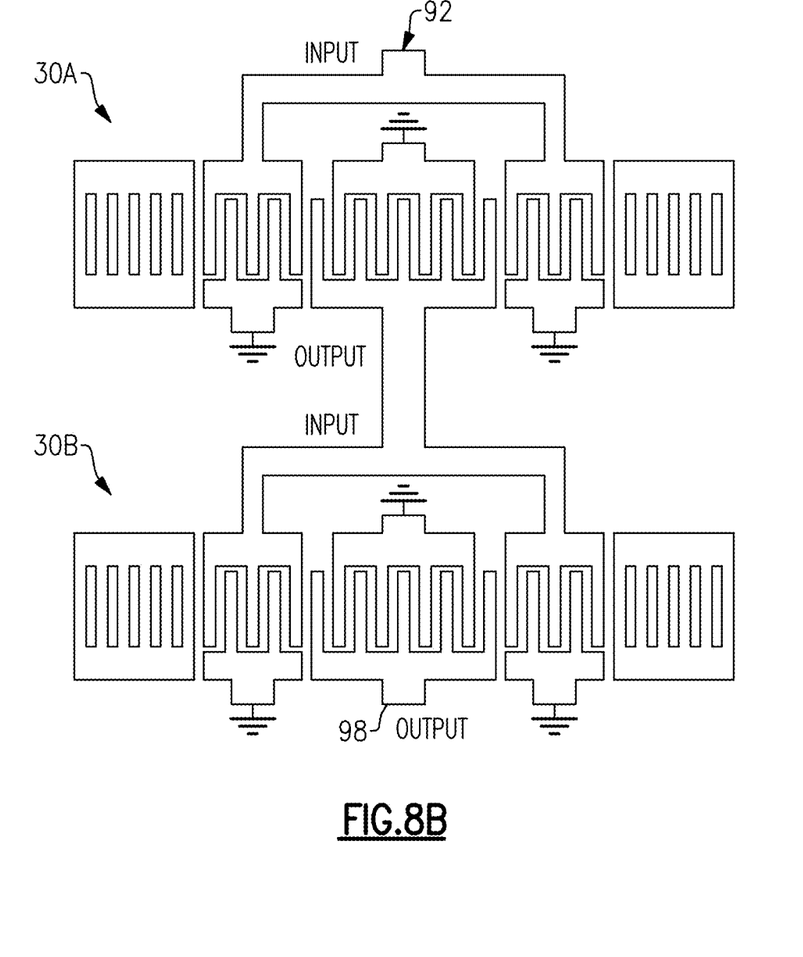
FIG. 8B illustrates two MMS filters in series with each other.

FIG. 8B illustrates two MMS filters 30A and 30B in series with each other. The series MMS filters 30A and 30B have an input 96 and an output 98. The output 98 can be connected to a ladder section in accordance with any suitable principles and advantages disclosed herein. In certain applications a combination of series and parallel MMS filters can be implemented.

In some instances, an acoustic wave filter can only include an MMS filter with fewer output tracks than input tracks. Such a filter can be implemented without a ladder section. Such a filter can be implemented in accordance with any suitable principles and advantages of the MMS filter 30 of FIG. 3, for example.

The filters disclosed herein can filter a radio frequency signal in a fifth generation (5G) New Radio (NR) operating band within Frequency Range 1 (FR1). FR1 can be from 410 megahertz (MHz) to 7.125 gigahertz (GHz), for example, as specified in a current 5G NR specification. The filters disclosed herein can filter a radio frequency signal in a fourth generation (4G) Long Term Evolution (LTE) operating band. The filters disclosed herein can have a passband that includes a 4G LTE operating band and a 5G NR operating band. Such a filter can be implemented in a dual connectivity application, such as an E-UTRAN New Radio-Dual Connectivity (ENDC) application. A multiplexer including any such filters can include one or more other filters with a passband corresponding to a 5G NR operating band and/or a 4G LTE operating band.

The filters disclosed herein can be standalone filters and/or included in any suitable multiplexer. A multiplexer includes a plurality of filters coupled to a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters.

Figure 9A:
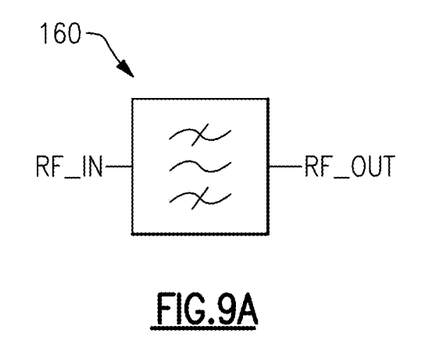
FIG. 9A is schematic diagram of an acoustic wave filter.

FIG. 9A is schematic diagram of an acoustic wave filter 160. The acoustic wave filter 160 can include an MMS filter and a ladder section in accordance with any suitable principles and advantages disclosed herein. The acoustic wave filter 160 is a band pass filter having a passband. The acoustic wave filter 160 is arranged to filter a radio frequency signal. The acoustic wave filter 160 includes an input port RF_IN and an output port RF_OUT. The acoustic wave filter 160 can include an MMS filter having an coupled to the input port RF_IN and an output coupled to the output port RF_OUT by way of a ladder section.

Example multiplexers will be discussed with reference to FIGS. 9B to 9E. Any suitable principles and advantages of these multiplexers can be implemented together with each other. Although example embodiments may be discussed with filters or duplexers for illustrative purposes, any suitable principles and advantages disclosed herein can be implemented in a multiplexer that includes a plurality of filters coupled together at a common node.

Figure 9B:
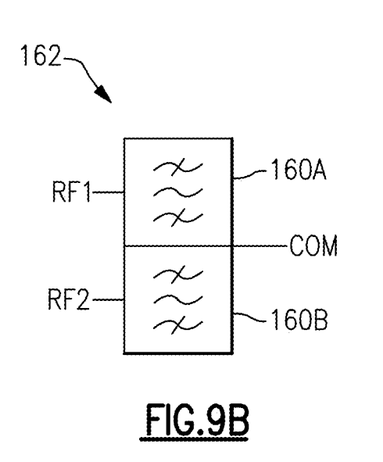
FIGS. 9B, 9C, 9D, and 9E are schematic diagrams of multiplexers that include a filter with an MMS filter and a ladder section according to an embodiment.

FIG. 9B is a schematic diagram of a duplexer 162 that includes a filter according to an embodiment. The duplexer 162 includes a first filter 160A and a second filter 160B coupled to together at a common node COM. One of the filters of the duplexer 162 can be a transmit filter and the other of the filters of the duplexer 162 can be a receive filter. In some other instances, such as in a diversity receive application, the duplexer 162 can include two receive filters. Alternatively, the duplexer 162 can include two transmit filters. The common node COM can be an antenna node.

The first filter 160A is an acoustic wave filter arranged to filter a radio frequency signal. The first filter 160A is coupled between a first radio frequency node RF1 and the common node COM. The first radio frequency node RF1 can be a transmit node or a receive node. The first filter 160A includes an MMS filter and a ladder section in accordance with any suitable principles and advantages disclosed herein.

The second filter 160B can be any suitable filter arranged to filter a second radio frequency signal. The second filter 160B can be, for example, an acoustic wave filter, an acoustic wave filter that includes an MMS filter and a ladder section, an LC filter, a hybrid acoustic wave LC filter, or the like. The second filter 160B is coupled between a second radio frequency node RF2 and the common node. The second radio frequency node RF2 can be a transmit node or a receive node.

Figure 9C:
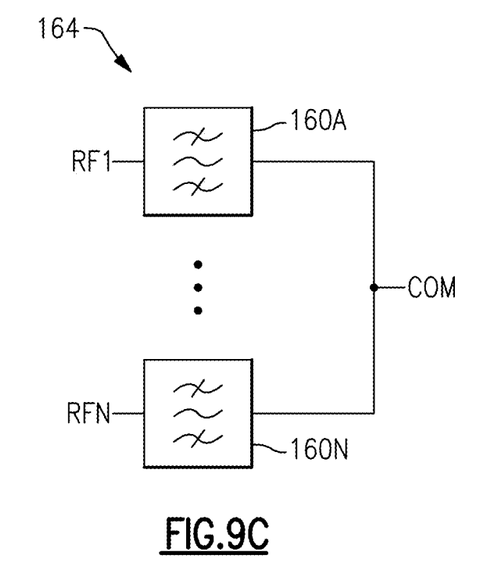

FIG. 9C is a schematic diagram of a multiplexer 164 that includes a filter according to an embodiment. The multiplexer 164 includes a plurality of filters 160A to 160N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A is coupled between a first radio frequency node RF1 and the common node COM. The first radio frequency node RF1 can be a transmit node or a receive node. The first filter 160A includes an MMS filter and a ladder section in accordance with any suitable principles and advantages disclosed herein. The other filter(s) of the multiplexer 164 can include one or more acoustic wave filters, one or more acoustic wave filters that include an MMS filter and a ladder section in accordance with any suitable principles and advantages disclosed herein, one or more LC filters, one or more hybrid acoustic wave LC filters, the like, or any suitable combination thereof.

Figure 9D:
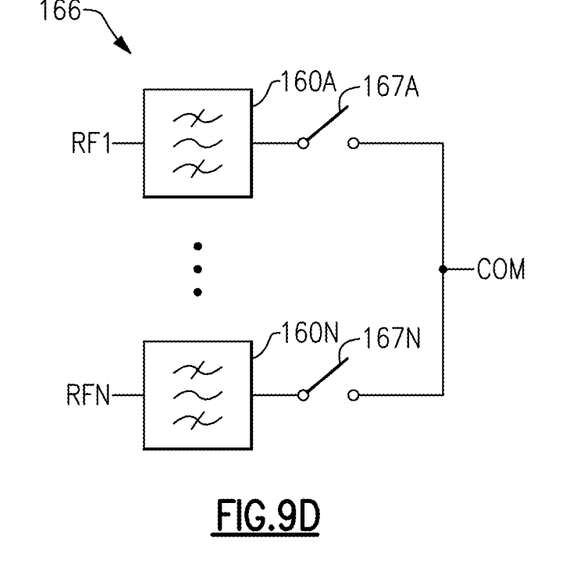

FIG. 9D is a schematic diagram of a multiplexer 166 that includes a filter according to an embodiment. The multiplexer 166 is like the multiplexer 164 of FIG. 9C, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filter 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

Figure 9E:
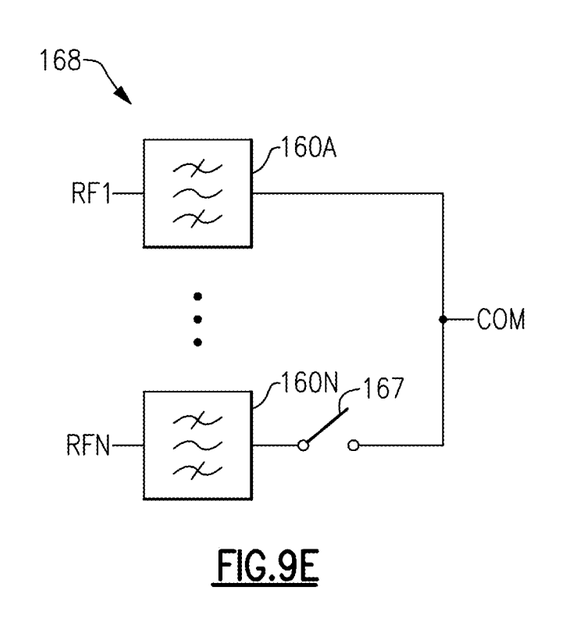

FIG. 9E is a schematic diagram of a multiplexer 168 that includes an acoustic wave filter according to an embodiment. The multiplexer 168 illustrates that a multiplexer can include any suitable combination of hard multiplexed and switched multiplexed filters. One or more filters in accordance with any suitable principles and advantages disclosed herein can be included in a filter (e.g., the filter 160A) that is hard multiplexed to the common node COM of the multiplexer 168. Alternatively or additionally, one or more filters in accordance with any suitable principles and advantages disclosed herein can be included in a filter (e.g., the filter 160N) that is switch multiplexed to the common node COM of the multiplexer 168.

Filters disclosed herein can be implemented in a variety of packaged modules. A module that includes a radio frequency component can be referred to as a radio frequency module. A packaged module can include a plurality of circuit elements positioned on a common packaging substrate. The packaging substrate can be a laminate substrate, for example. A packaged module can include one or more filters, as well as one or more radio frequency amplifiers and/or one or more radio frequency switches. A packaging structure can enclose circuit elements of a package module. In certain applications, a low band module, a low mid band module, or a mid band module can include a filter in accordance with any suitable principles and advantages disclosed herein. In some applications, a diversity receive module can include a filter in accordance with any suitable principles and advantages disclosed herein.

Figure 10:
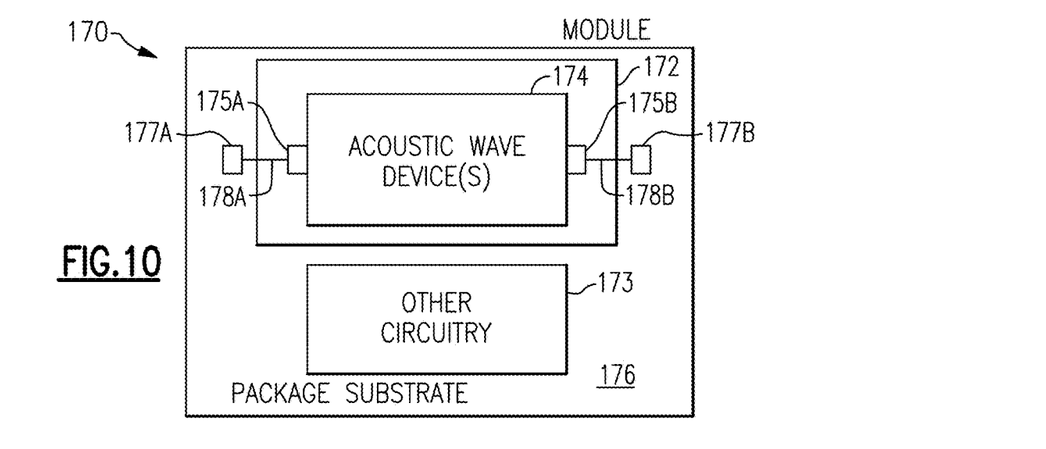
FIGS. 10, 11, and 12 are schematic block diagrams of modules that include a filter according to an embodiment.
Figure 11:
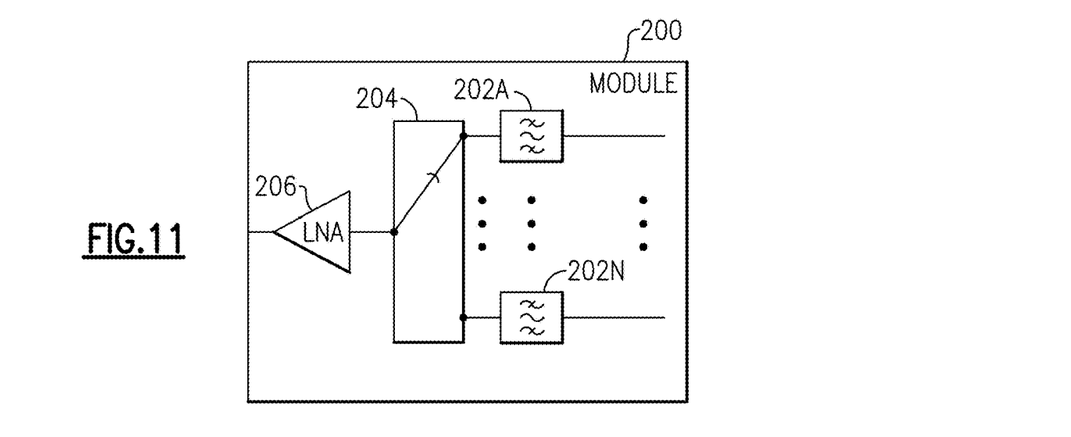
Figure 12:
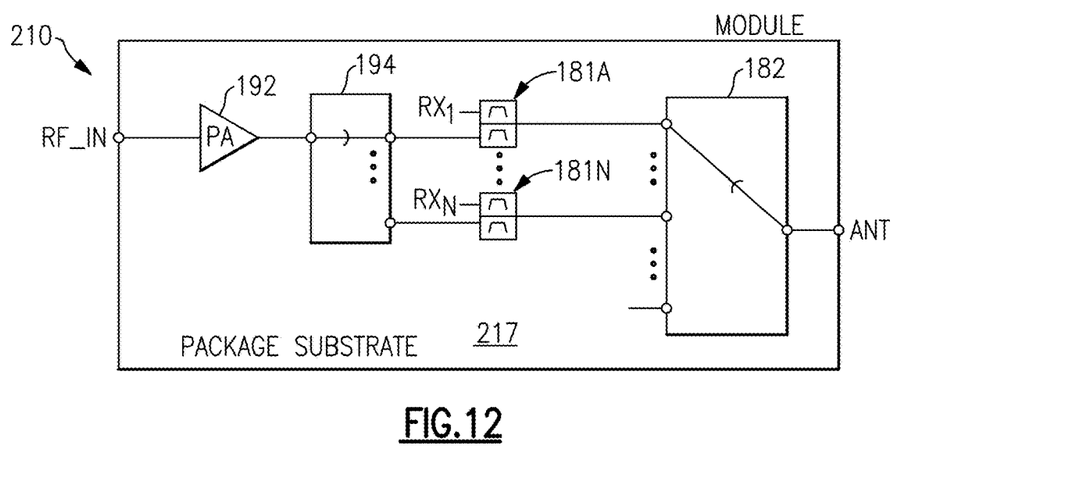

Some example packaged modules will now be disclosed in which any suitable principles and advantages of the filters disclosed herein can be implemented. FIGS. 10 to 12 are schematic block diagrams of illustrative packaged modules according to certain embodiments. Any suitable combination of features of these packaged modules can be implemented with each other.

FIG. 10 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include a filter that includes an MMS filter and a ladder section.

The acoustic wave component 172 shown in FIG. 10 includes acoustic wave devices 174 and terminals 175A and 175B. The acoustic wave devices 174 can include an MMS filter and a ladder section in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 10. The packaging substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. Accordingly, the other circuitry 173 can include one or more radio frequency circuit elements. The other circuitry 173 can be electrically connected to the one or more acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

FIG. 11 is a schematic block diagram of a module 200 that includes filters 202A to 202N, a radio frequency switch 204, and a low noise amplifier 206 according to an embodiment. One or more filters of the filters 202A to 202N can include an MMS filter and a ladder section in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

FIG. 12 is a schematic diagram of a radio frequency module 210 that includes a filter according to an embodiment. As illustrated, the radio frequency module 210 includes duplexers 181A to 181N, a power amplifier 192, a radio frequency switch 194 configured as a select switch, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier, such as the power amplifier 192, can be referred to as a power amplifier module. A radio frequency module can include a subset of the elements illustrated in FIG. 12 and/or additional elements. The radio frequency module 210 may include one or more filters with an MMS filter and a ladder section in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include a filter in accordance with any suitable principles and advantages disclosed herein. Similarly, one or more of the receive filters can include a filter in accordance with any suitable principles and advantages disclosed herein. Although FIG. 12 illustrates duplexers, any suitable principles and advantages disclosed herein can be implemented in other multiplexers (e.g., quadplexers, hexaplexers, octoplexers, etc.) and/or in switched multiplexers and/or with standalone filters.

The power amplifier 192 can amplify a radio frequency signal. The illustrated radio frequency switch 194 is a multi-throw radio frequency switch. The radio frequency switch 194 can electrically couple an output of the power amplifier 192 to a selected transmit filter of the transmit filters of the duplexers 181A to 181N. In some instances, the radio frequency switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Filters disclosed herein can be implemented in wireless communication devices. A wireless communication device can be a mobile device, such as a smart phone. The wireless communication device can include a battery and one or more antennas. A filter in accordance with any suitable principles and advantages disclosed herein can filter a radio frequency signal received by way of an antenna. The filter of FIG. 7 can filter a radio frequency signal in a transmit signal path between a power amplifier and an antenna.

Figure 13:
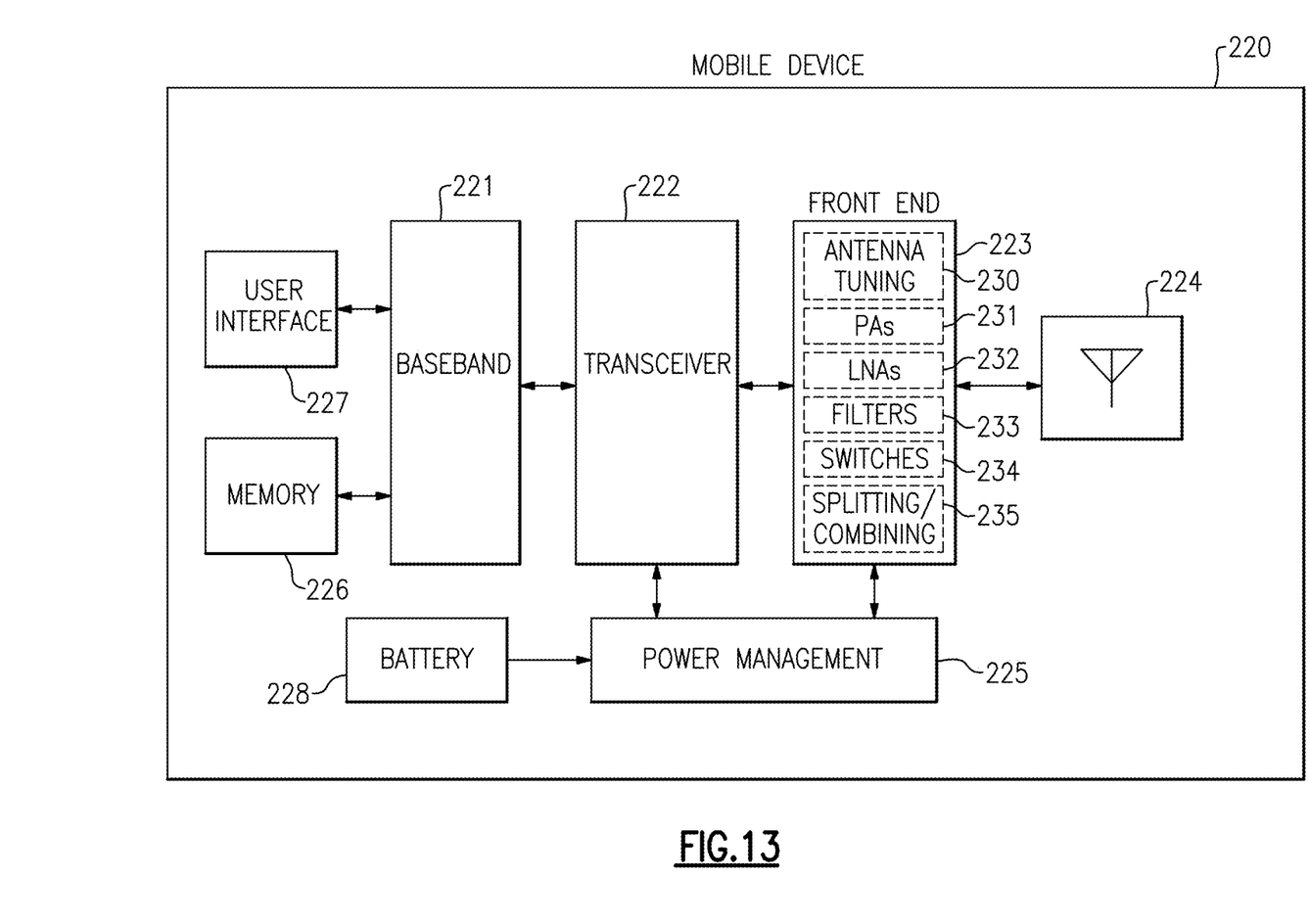
FIG. 13 is a schematic block diagram of a wireless communication device that includes a filter according to an embodiment.

FIG. 13 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 13 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more filters that include an MMS filter and a ladder section in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 13, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 13, the power management system 225 receives a battery voltage from the battery 228. The battery 228 can be any suitable battery for use in the wireless communication device 220, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz. In certain applications, filters disclosed herein can filter a signal having a frequency in a range from about 400 MHz to 3 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave filter comprising:
a multi-mode surface acoustic wave filter including an input that is single-ended and an output that is single-ended, the input including at least one more track than the output, and the multi-mode surface acoustic wave filter having a higher impedance at the output than at the input;
a ladder section connected to the output of the multi-mode surface acoustic wave filter, the ladder section including at least one shunt acoustic wave resonator and at least one series acoustic wave resonator; and
a shunt inductor, the ladder section coupled between the multi-mode surface acoustic wave filter and the shunt inductor, and the acoustic wave filter configured to filter a radio frequency signal.

2. The acoustic wave filter of claim 1 wherein the acoustic wave filter is configured as a receive filter.

3. An acoustic wave filter comprising:
a multi-mode surface acoustic wave filter including an input that is single-ended and an output that is single-ended, the input including at least one more track than the output, and the multi-mode surface acoustic wave filter having a higher impedance at the output than at the input;
a ladder section connected to the output of the multi-mode surface acoustic wave filter, the ladder section including at least one shunt acoustic wave resonator and at least one series acoustic wave resonator; and
a shunt inductor, the ladder section coupled between the multi-mode surface acoustic wave filter and the shunt inductor, the acoustic wave filter configured to filter a radio frequency signal, and the acoustic wave filter is configured as a transmit filter.

4. The acoustic wave filter of claim 1 wherein the multi-mode surface acoustic wave filter includes a plurality of interdigital transducer electrodes longitudinally coupled to each other.

5. The acoustic wave filter of claim 1 wherein the at least one more track is a single track.

6. The acoustic wave filter of claim 1 wherein the input has more interdigital transducer electrode fingers than the output.

7. The acoustic wave filter of claim 1 wherein the acoustic wave filter has a passband, and the output has an impedance of greater than 50 Ohms for the passband.

8. The acoustic wave filter of claim 1 wherein the at least one shunt acoustic wave resonator and the at least one series acoustic wave resonator are surface acoustic wave resonators.

9. A radio frequency system comprising:
a low noise amplifier; and
an acoustic wave filter including a multi-mode surface acoustic wave filter, a shunt inductor, and a ladder section coupled between the multi-mode surface acoustic wave filter and the shunt inductor; the ladder section being in a signal path between the multi-mode surface acoustic wave filter and an input of the low noise amplifier, the multi-mode surface acoustic wave filter including an input and an output, the input of the multi-mode surface acoustic wave filter having at least one more track than the output of the multi-mode surface acoustic wave filter, and the multi-mode surface acoustic wave filter having a higher impedance at the output than at the input.

10. The radio frequency system of claim 9 further comprising an antenna, the acoustic wave filter being in a signal path between the antenna and the low noise amplifier.

11. The radio frequency system of claim 9 comprising a multiplexer, the multiplexer including all receive filters, and the acoustic wave filter being one of the receive filters of the multiplexer.

12. The radio frequency system of claim 9 wherein the input is single-ended and the output is single-ended.

13. The radio frequency system of claim 9 wherein the input of the multi-mode surface acoustic wave filter has more interdigital transducer electrode fingers than the output of the multi-mode surface acoustic wave filter.

14. The radio frequency system of claim 9 wherein the output of the multi-mode surface acoustic wave filter has an impedance of greater than 50 Ohms.

15. A wireless communication device comprising:
the acoustic wave filter of claim 1;
an antenna operatively coupled to the acoustic wave filter;
a radio frequency amplifier operatively coupled to the acoustic wave filter and configured to amplify a radio frequency signal; and
a transceiver in communication with the radio frequency amplifier.

16. The wireless communication device of claim 15 wherein the radio frequency amplifier is a low noise amplifier having an input, and the ladder section is in a signal path between the multi-mode surface acoustic wave filter and the input of the low noise amplifier.

17. The wireless communication device of claim 15 wherein the at least one more track is a single track.

18. The wireless communication device of claim 15 wherein the input of the multi-mode surface acoustic wave filter has more interdigital transducer electrode fingers than the output of the multi-mode surface acoustic wave filter.

19. The wireless communication device of claim 15 wherein the output of the multi-mode surface acoustic wave filter has an impedance of greater than 50 Ohms.

20. The wireless communication device of claim 15 wherein the wireless communication device is a mobile phone.

* * * * *